United States Patent
Kim et al.

(10) Patent No.: US 6,610,457 B2
(45) Date of Patent: Aug. 26, 2003

(54) ORGANIC POLYMERS FOR BOTTOM ANTIREFLECTIVE COATING, PROCESS FOR PREPARING THE SAME, AND COMPOSITIONS CONTAINING THE SAME

(76) Inventors: Jun Young Kim, 74-10 Youngsung Ri, Samsung Myun, Eumsung Kun, Choongchungbook Do (KR); Sung Hyun Ha, 74-10 Youngsung Ri, Samsung Myun, Eumsung Kun, Choongchungbook Do (KR); Kwang Duk Ahn, Polymer & Biomaterials Research Center Life Science Division, Korea Institute of Science and Technology P.O Box 131, Cheongryang, Seoul 130-650 (KR); Jong Hee Kang, Polymer & Biomaterials Research Center Life Science Division, Korea Institute of Science and Technology P.O Box 131, Cheongryang, Seoul 130-650 (KR)

( * ) Notice: Subject to any disclaimer, the term of this patent is extended or adjusted under 35 U.S.C. 154(b) by 16 days.

(21) Appl. No.: 09/975,967

(22) Filed: Oct. 15, 2001

(65) Prior Publication Data

US 2003/0073028 A1 Apr. 17, 2003

(30) Foreign Application Priority Data

Aug. 30, 2001 (KR) .................................... 10-2001-53032

(51) Int. Cl.$^7$ ........................... G03C 1/76; C08F 220/68
(52) U.S. Cl. ................. 430/271.1; 430/311; 426/219.6; 426/232.1; 426/304; 426/320; 426/326
(58) Field of Search ................................. 549/402, 403; 526/326, 320, 219.6, 232.1, 304; 430/271.1, 311

(56) References Cited

PUBLICATIONS

US 2002/0028302 A1, Mar. 7, 2002 Okazaki et al.*

* cited by examiner

Primary Examiner—Rosemary Ashton
(74) Attorney, Agent, or Firm—G W i P S

(57) ABSTRACT

A bottom antireflective coating layer is made from the compositions of organic photosensitive materials that contain isoflavone chromophore by photolithography utilizing a deep ultraviolet light source for producing a submicro-level, large-scale integrated chip. A copolymer containing an isoflavone chromophore is used as a bottom antireflective coating layer for fabricating a 64-megabit or gigabit DRAM. The antireflective coating layer enables not only the suppression of reflections of light that occur under the substrate layer but also the removal of standing waves. Consequently, a high-resolution sub-micron of a 100~200 nm integrated circuit is able to be stably formed. Therefore, it is possible to increase the production of semiconductors.

8 Claims, No Drawings

ORGANIC POLYMERS FOR BOTTOM ANTIREFLECTIVE COATING, PROCESS FOR PREPARING THE SAME, AND COMPOSITIONS CONTAINING THE SAME

FIELD OF THE INVENTION

The present invention relates to a bottom antireflective coating layer for suppressing a reflective notching that occurs at a substrate surface under a photoresist during the exposing process of photolithography using a deep ultraviolet light source to form a submicron-level, large-scale semiconductor integrated-circuit and eliminating the effect of a standing wave that occurs due to a variation of thickness of photoresist and using a light source. More particularly, it is related to the compositions of antireflective coating materials that contain an isoflavone chromophore and to a method of producing the compositions.

BACKGROUND OF THE INVENTION

An organic antireflective coating (ARC) layer is a very thin film of light-absorbing material used in photolithography for stably forming a submicron pattern of 100 nm~200 nm or less that is essential to producing a giga-bit level, large-scale integrated chip. This thin film is called a bottom antireflective coating (BARC or bottom ARC) because it is coated primarily on a substrate surface under the photoresist for exposing the process of deep ultraviolet light.

In conventional photolithography, there are problems with reflective notching occurring at a substrate surface under a photoresist during an exposing process and an effect of a standing wave occurring due to a variation of thickness of photoresist and using a light source. Due to such problems, it is difficult to stably form a submicron pattern of 100 nm~200 nm of less on the substrate surface. Therefore, an organic bottom ARC layer is needed for absorbing incident light of specific wavelength.

The ARC layer must have an excellent property of light absorption, as the wavelength of light source is shortened (G-line, T-line, KrF, ArF, F2 etc.) in accordance with the technology of submicron-level, large-scale integrated chip advanced (M. Padmanaban et al., Proc. SPIE, 3678, 550 (1999); E. Iguchi et al., Proc. SPIE, 3999, 521 (2000); M. Padmanaban et al., Proc. SPIE, 333, 206 (1998)).

Remarkably, even though a variety of techniques have been developed in the semiconductor manufacturing industry, the conventional spin-coated photolithography, a photoresist on a silicone substrate for a subsequent exposure process, becomes no more suitable to apply for stably producing a sub-micron pattern of 100~200 nm. Consequently, it is necessary to apply a special technique of thin film coating prior to coating a photoresist. The antireflective coating layer in the photolithography becomes indispensable in preventing an effect of a standing wave in the photoresist occurring from interference between an incident light to a photoresist and the reflected light from the substrate surface. The coating will also prevent or remarkably reduce the reflections caused from the topography of already-formed circuits, as well as reflective notching on the edges. Therefore, a desired critical dimension (CD) of submicron circuit could be controlled accurately. It also could ease the tolerance conditions for the producing process.

This antireflective coating layer could be divided into an organic material being spin-coated according to its compositions and an inorganic material being coated by chemical vapor deposition. In recent years, organic antireflective coatings have been increasingly used.

Particularly, due to an advanced exposure process used in a high energy short wavelength such as a deep ultraviolet light, a chromophore having a high light absorption in the deep ultraviolet light spectrum is required, mainly leading the development of an organic antireflection coating layer using naphthalene or anthracene derivatives. (J. Fahey et al., Proc. SPIE, 2195, 422 (1994); K. Mizutani et al., Porc. SPIE. 3677, 518 (1999)). This technique is disclosed in U.S. Pat. Nos. 5,693,692, 5,851,738, 5,919,599 and 6,033,830.

SUMMARY OF THE INVENTION

A technological objective of the present invention is to provide a novel organic, photosensitive material that contains an isoflavone chromophore, as well as a method for producing the same. Such a material would be able to be used as an antireflective coating layer in a photolithographic process using a Krytonfluoride (KrF) eximer laser of 248 nm-wavelength and Argonfluoride (ArF) eximer laser of 193 nm-wavelength as an exposing light source for producing a large-scale integrated semiconductor device.

Another objective of the present invention is to provide organic polymer material that has an isoflavone chromophore as a side chain for preventing light reflections that are transmitted through the photoresist during a light-exposing process, as well as a method for producing the same.

Another objective of the present invention is to provide the composition of a bottom, antireflective coating layer using the organic polymer materials.

Yet another objective of the present invention is to provide a protective coating layer produced by using the composition of a bottom antireflective coating layer, as well as a method for producing the same.

DETAILED DESCRIPTION OF THE INVENTION

Generally, an incident light is transmitted, absorbed, reflected or refracted depending on the optical property of materials and encountered interfaces. By utilizing this well-known property of light, the present invention develops an organic antireflective coating (ARC) layer for absorbing incident light. If an organic ARC layer has the same refractive index as the photoresist has, there would be no reflections at the interface of the photoresist and the ARC layer. For this reason, the ARC layer must have the same optical property as a commercial DUV photoresist to have the identical performance of a lithographic. Consequently, the organic antireflective coating (ARC) layer of the present invention is designed to absorb the incident light so that the light penetrated through the interface of the photoresist and the ARC layer will be absorbed before reaching the substrate surface.

Therefore, the organic bottom ARC layer should have excellent high light absorption against a specific exposure wavelength of 248 nm, 193 nm and 157 nm of eximer laser for photolithographic process. Along with the propagation of a photolithographic process that uses a Kyrtonfluoride (KrF) eximer laser, the role of antireflective coating layer becomes a more important matter. Therefore, most compositions of an organic antireflective layer are required to have the following conditions:

It must have a proper optical constant such as a refractive index (n) and an extinction coefficient (k) for a light source, both of which are used in semiconductor production.

The organic bottom antireflective coating layer should have a high selection ratio with respect to plasma dry etching compared with an upper layer of photoresist and should not have defects in accordance with dry etching.

It must not have a phenomenon of inter-mixing the photoresist with the bottom antireflective coating layer, and it must have a reactive site for the sake of forming an appropriate crosslink in the organic polymer.

The organic bottom antireflective coating layer should be in acid equilibrium with the photoresist after the exposing and developing process so as not to induce undercutting or footing at a sublayer of pattern.

It must have the capability of layer formation and layer uniformity for forming a proper thickness of bottom antireflective coating layer suitable to process revolutions per minute (RPMs).

A polymer for a bottom antireflective coating (BARC) layer of the present invention comprises isoflavone chromophore that has a high light absorption of 248 nm and 193 nm of exposure wavelengths in a main chain, monomer contained hydroxyl group for crosslinking during formation of an antireflective coating layer, a co-monomer for adjusting the property of polymer, and co-polymer, ter-polymer or quarto-polymer comprised of three or four different kinds of monomers. A general formula of polymer is represented as follows:

General Formula I

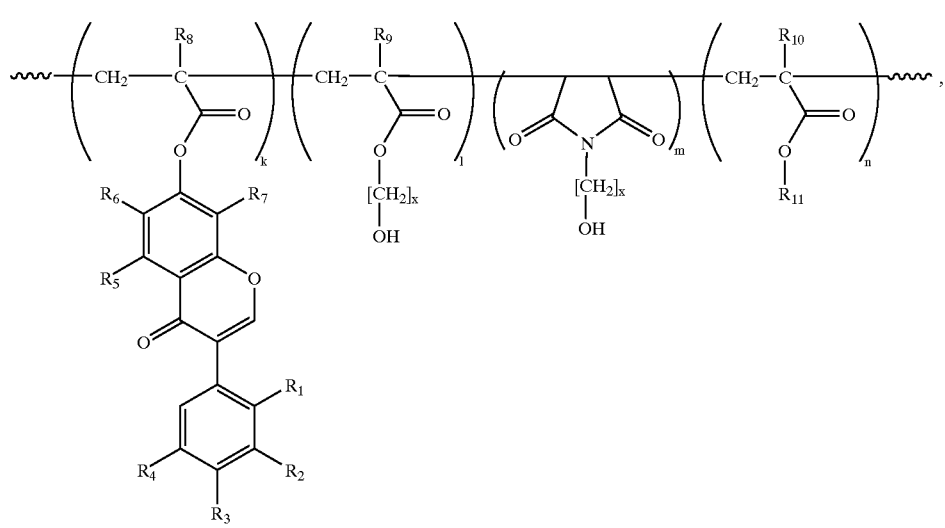

That is, a polymer of the present invention of a bottom antireflective coating layer has the structure $-(M_a)_k-(M_b)_l-(M_e)_m-(M_d)_n-$. Among them, (1)

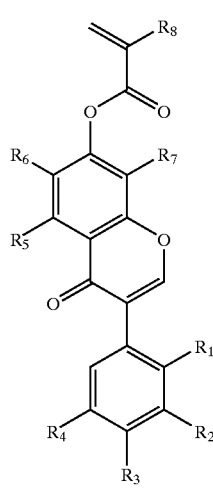

$M_a$ is an isoflavone chromophore monomer containing a (meta) acrylate or methyester represented by the above Formula (1).

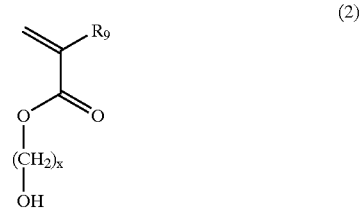

(2)

$M_b$ is a (meta) acrylate monomer containing a hydroxyl group, which is represented by the above Formula (2).

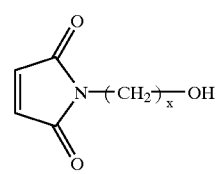

(3)

$M_e$ is an alkylmaleimide monomer containing a hydroxyl group, which is represented by the above Formula (3).

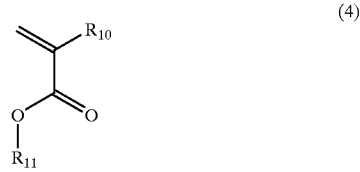

(4)

And $M_d$ is a (meta) acrylate monomer, which is represented by the above Formula (4).

In the above Formulas (1), (2), (3) and (4), $R_1 \sim R_7$ independently represent each of hydrogen, methoxy, hydroxy, halogen, aldehyde, alkoxyalkyl having one to six carbon atoms ($C_1$~$C_6$) or alkoxyalkane having one to five carbon atoms ($C_1$~$C_5$). R8, R9 and R10 represent a hydrogen or methyl group. R11 represent alkyl group having one to six carbon atoms ($C_1$~$C_6$). The value of subscript x is from one to six. The subscript k, l, m and n represent the mol ratio of each monomer.

In General Formula I, the values of the mol ratio are k, 0.1~0.5, l and m, 0.0~0.4 and n, 0.3~0.6 based on the total molar feed ratio of k+l+m+n.

The isoflavone chromophore monomer (1) of the present invention has excellent plasma etching compared with the conventional anthracene group chromophore derivative. It has not only a high light absorption of 248 nm wavelength spectrum of Krytonfluoride (KrF) eximer laser, but also has enhanced adhesion on a wafer due to the substitution of a hydrophilic moiety.

The polymer of General Formula I of the present invention could be produced by reacting a radical initiator for 2 to 24 hours under an inert gas environment such as a Nitrogen or Argon. The radical initiators commonly used are thermal decomposition initiators such as a benzoil peroxide (BPO), 2,2'-azobisisobutyronitrile (AIBN) and Di-tert-butyl peroxide (DTBP). If one of these radical initiators is used, a reaction would be performed at the temperature of 50°~90° C. A solvent, such as a dioxane, tetrahydrofuran and benzene, is popularly used as a polymerizing solvent. Therefore, it is possible to synthesize a polymer having a proper molecular weight with etching performance by adjusting each amount of monomer, polymerizing solvent or radical initiator. The molecular weight of a polymer of General Formula I should be within a range of 5,000 to 100,000 g/mol measured by a gel-permeation chromatography (GPC). The range of molecular weight of a polymer could be adjusted for proper coating capability by varying the synthesizing conditions.

The compositions of an organic bottom antireflective coating (BARC) material is produced through the following process: 0.5~50 weight % of a polymer of the General Formula I is added to an organic solvent having an excellent coating layer forming capability, such as a propyleneglycol monomethylether acetate (PGMEA), ethyl-3-ethoxypropionate, methyl 3-methoxypropionate, or cyclohexanone used for manufacturing semiconductor devices. Then, the solution is dissolved by adding various functional additives. Next, the solution is filtered and coated on a silicon wafer to form a bottom ARC film layer. Then, the coated silicon wafer is hard-baked to bring crosslinking to a proper temperature.

By applying this antireflective coating layer, the problems caused by the reflections in a photolithographic process using deep ultraviolet could be entirely controlled so that the production of semiconductor devices is facilely performed.

According to the present invention, the polymer of an antireflective coating layer containing isoflavone chromophore reveals excellent lithographic performance as an organic bottom antireflective coating layer in 248 nm, 193 nm and 157 nm of light exposure wavelength. The present polymer is verified as a useful material for forming a submicron circuit of semiconductor chips due to fast plasma etching speed compared with the conventional antireflective coating layer formed based on anthracene chromophore.

IMPLEMENTING EXAMPLE

Hereinafter, according to the present invention, a method of producing a methacrylic monomer and a methacrylic polymer necessitated an isoflavone chromophore. The composition of an organic bottom antireflective coating layer applied to a methacrylic monomer and a methacrylic polymer, as well as the producing method, are specifically described in detail, accompanied by implementing examples. However, the purpose of providing implementing examples is to explain the present invention, although the present invention is not limited to the implementing examples.

EXAMPLE 1

Synthesizing Isoflavonyl Methacylate as a Chromophore Monomer (IFVMA)

Reaction Formula 1:

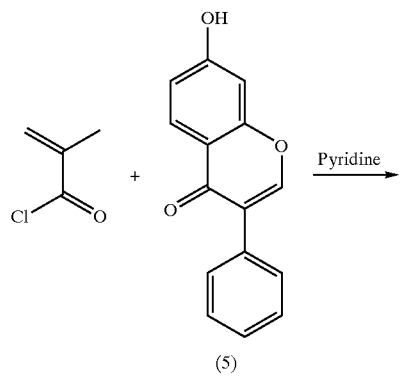

(5)

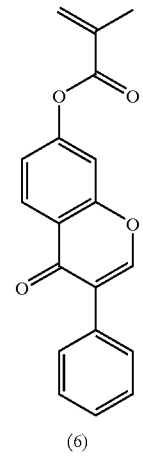

(6)

Dissolve 7-hydroxyisoflavone (5)(100.00 g, 0.42 mol) into pyridine (150 ml) and stir for five hours at a temperature of 4° C., gradually adding methacryloyl chloride (42.00 g, 0.42 mol). After precipitating the reactant in cold water and filtering, extract the filtered reactant several times with methylene chloride, and refine. Then, dry the product in a vacuum to recover a light yellowish crystalline of isoflavonyl methacrylate (6). Yield: 116.4 g (82%). Melting point: 168° C.

EXAMPLE 2

Synthesizing an Isoflavonyl Methacrylate Monomer (MIFVMA) Contained Methoxy Group Reaction Formula 2:

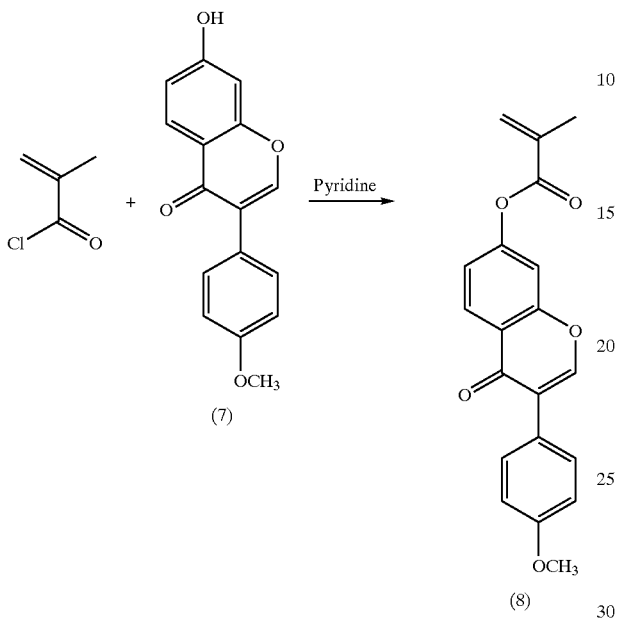

Dissolve formononetin (7)(100.00 g, 0.37 mol) into pyridine (150 ml) and stir the solution for three hours at a temperature of 4° C., gradually adding methacryloyl chloride (37.00 g, 0.37 mol). After precipitating the reactant in cold water and filtering, extract the filtered reactant several times with chloroform, and refine. Then, dry the product in a vacuum to recover a deep yellowish crystalline of the isoflavonyl methacrylate (8) methoxy group. Yield: 119.2 g (87%) Melting point: 194° C.

EXAMPLE 3

Synthesizing Terpolymer Using Monomer (2), (4) and (6)

Place Isoflavonyl Methacylate (IFVMA) (6) (20.00 g, 65.5 mmol), hydroxyethymethacrylate (HEMA) (2) (8.52 g, 65.5 mmol), methylmethacrylate (MMA) (4) (8.74 g, 87.3 mmol) and 5-mol % of AIBN in a polymerizing container and dissolve with dioxane (70 ml). Then, polymerize the solution for 10 hours at a temperature of 60° C. under a nitrogen environment. After precipitating the reactant in a sufficient methanol, filter and dry the synthesizing terpolymer of poly (IFVMA-HEMA-MMA). A yield of poly (IFVMA-HEMA-MMA) is 83%. An weight average molecular weight measured by GPC is about 46.00 g/mol so as to easily form a film layer.

EXAMPLE 4

Synthesizing Terpolymer Using Monomer (2), (4) and (8)

Place methoxy substituted Isoflavonyl Methacrylate (MIFVMA)(8)(22.00 g, 65.4 mmol), hydroxyethylmethacrylate (HEMA)(2)(98.52 g, 65.5 mmol), methymethacrylate (MMA)(4)8.74 g, 87.3 mmol) and 5-mol % of AIBN in a synthesizing container and dissolve with tetrahydrofuran (79 ml). Polymerize the solution for 10 hours at a temperature of 60° C. under a nitrogen environment. After precipitating the reactant in a sufficient methanol, filter and dry the synthesizing terpolymer of poly (MIFVMA-HEMA-MMA). A yield of poly (MIFVMA-HEMA-MMA) is 91%. An average molecular weight measured by GPC is approximately 44,000 g/mol so as to easily form a film layer.

EXAMPLE 5

Synthesizing Quatropolymer Using Monomer (2), (3), (4) and (6)

Place Isoflavonyl Methacylate (IFVMA)(6) (9.00 g, 38 mmol), hydroxyethylmaleimide (HOEMI) (3) (5.36 g, 38 mmol), hydroxyethylmethacrylate (HEMA) (2) (8.52 g, 65.5 mmol), methymethacrylate (MMA) (4) (8.74 g, 87.3 mmol) and 5 mol % of AIBN in a polymerizing container and dissolve with a mixed solvent of tetrahydrofuran and methylethylketone (73 ml). Polymerize the solution for 10 hours at a temperature of 60° C. under a nitrogen environment. After precipitating the reactant in a sufficient methanol, the filtering and drying process are performed for synthesizing quatropolymer of poly (IFVMA-HOEMI-HEMA-MMA). A yield of poly (IFVMA-HOEMI-HEMA-MMA) is 79%. An average molecular weight measured by GPC is about 40,500 g/mol so as to easily form a film layer.

EXAMPLE 6

Synthesizing Quatropolymer Using Monomer (2), (4), (6) and (8)

Place IFVMA Monomer (6) (9.00 g, 38 mmol), MIFVMA Monomer (8) (10.3 g, 38 mmol), hydroxyethylmethacrylate (2) (HEMA) (8.52 g, 65.5 mmol), methylmethacrylate (MMA) (4) (8.74 g, 87.3 mmol) and 5 mol % of AIBN in a polymerizing container and dissolve with a mixed solvent of tetrahydrofuran and methylethylketone (73 ml). Then, polymerize the solution for 10 hours at a temperature of 60° C. in a nitrogen environment. After precipitating the reactant in a sufficient methanol, filter and dry for synthesizing quatropolymer of poly (IFVMA-MIFVMA-HEMA-MMA). A yield of poly (IFVMA-MIFVMA-HEMA-MMA) is 88%. An average molecular weight measured by GPC is approximately 43,500 g/mol so as to easily form a film layer.

EXAMPLE 7

Producing and Applying the Compositions of an Organic Bottom Antireflective Coating Layer One of the polymers being obtained in the above examples 1 through 6 is dissolved in propylene glycol monomethylether acetate with a weight ratio of 1:20~1:50. Stir the solution after adding various additives such as an acid-catalyzed thermo-crosslinker and a stabilizer. Filter the solution through a 0.05 μm of membrane filter to produce an organic solution of antireflective coating layer. This organic solution is spin-coated on a silicon wafer and crosslinked for 10 to 120 seconds at a temperature of 100° C.~250° C. to prevent intermixing with a photoresist. Hereinafter, following a general producing process, a photolithographic process for submicron circuit is performed by spin-coating a commercial photoresist on the antireflective coating layer. The compositions of organic bottom antireflective coating layer applied to polymers obtained from the implementing examples are in acid equilibrium with photoresist after the light-exposing process during development. Consequently, there is no undercutting or footing formed at the sublayer pattern of photoresist. A dimensional variation in a submicron pattern due to reflective notching is so negligible that the formation of a submicron circuit is stably performed.

As disclosed throughout the implementing examples, because of the antireflective coating layer being used, polymer with the basic structure of terpolymer or quartopolymer adapts a covalent bond of side chain with a high light-absorptive isoflavone chromophore, and the ARC layer has excellent heat stability without generating gases during a high heat exposure process. Also, the ARC layer of the present invention not only has the capability of sufficient light absorption to be qualified as a bottom antireflective coating layer, but also have the capability of suppressing reflections of light that occur underneath the substrate layer during the exposure process and eliminating the standing waves that occur due to the thickness variation of photoresist and use of a light source. Due to a high etching capability with respect to plasma, it is enabled to stably photo-transmit a clear image of a submicron circuit on the substrate surface.

Accordingly, when a copolymer of the present invention is applied to the exposure process of a bottom antireflective coating layer which uses 248 nm, 193 nm or 157 nm of exposure wavelength of eximer laser, a formation of submicron pattern for an integrated circuit system having a 64-mega bit DRAM or higher memory device of Giga bit or 0.1~0.2 micron level pattern is stably performed. Consequently, the production rate of semiconductor devices could be remarkably increased.

While the present invention has been described in detail with its preferred embodiments, it should be understood that further modifications are possible. The present application is therefore intended to cover any variations, uses or adaptations of the invention following the general principles thereof and includes such departures from the present disclosure as come within known or customary practice in the art to which this invention pertains within the limits of the appended claims.

What is claimed is:

1. A monomer of isoflavonyl derivative is applied to a semiconductor photolithographic process for an antireflective coating layer, a chemical formula of said monomer represents as follows:

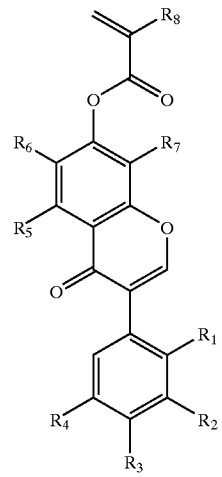

wherein, $R_1$~$R_7$ represent independently hydrogen, methoxy, hydroxy, halogen, aldehyde, alkoxyalkyl having one to six carbon atoms ($C_1$~$C_6$) or alkoxyalkane having one to five carbon atoms ($C_1$~$C_5$); and $R_8$ represents hydrogen or methyl group.

2. A binder polymer has repeating units in a main chain including co- to quatro-, a structural formula of said binder polymer represents as below:

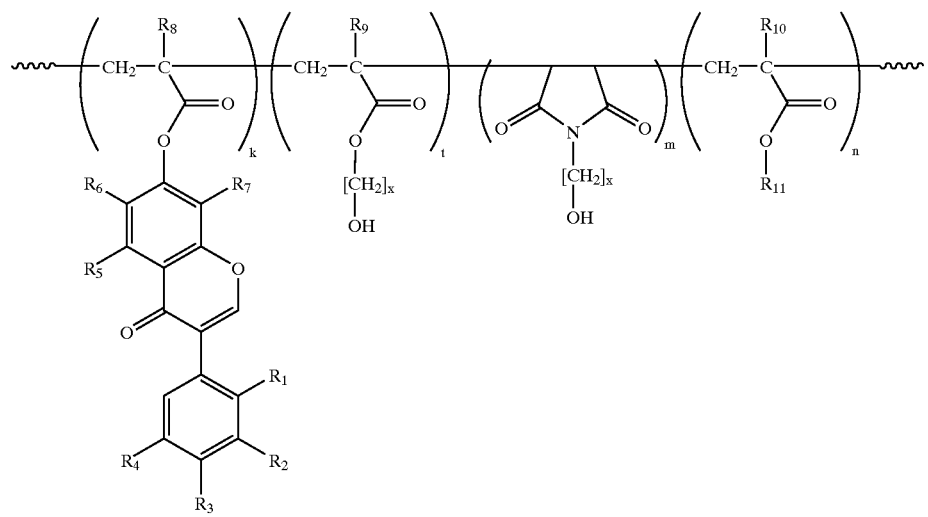

wherein, $R_1$~$R_7$ represents independently hydrogen, methoxy, hydroxy, halogen, aldehyde, alkoxyalkyl having one to six carbon atoms ($C_1$~$C_6$) or alkoxyalkane having one to five carbon atoms ($C_1$~$C_5$); $R_8$, $R_9$ and $R_{10}$ represent hydrogen or methyl group; $R_{11}$ represent alkyl group having from one to six carbon atoms ($C_1$~$C_6$); subscript x is from one to six; and the subscript k, l, m and n representing the mol ratio of each monomer has values that k is 0.1~0.5, l and m are 0.0~0.4 and n is 0.3~0.6 based on a total molar feed ratio of component k+l+m+n.

3. The binder polymer of claim 2, wherein a weight average molecular weight of said polymer is in a range of 10,000~100,000 g/mol.

4. A composition of bottom antireflective coating material for processing semiconductor comprises:
   binder polymer represented by a following structural formula,

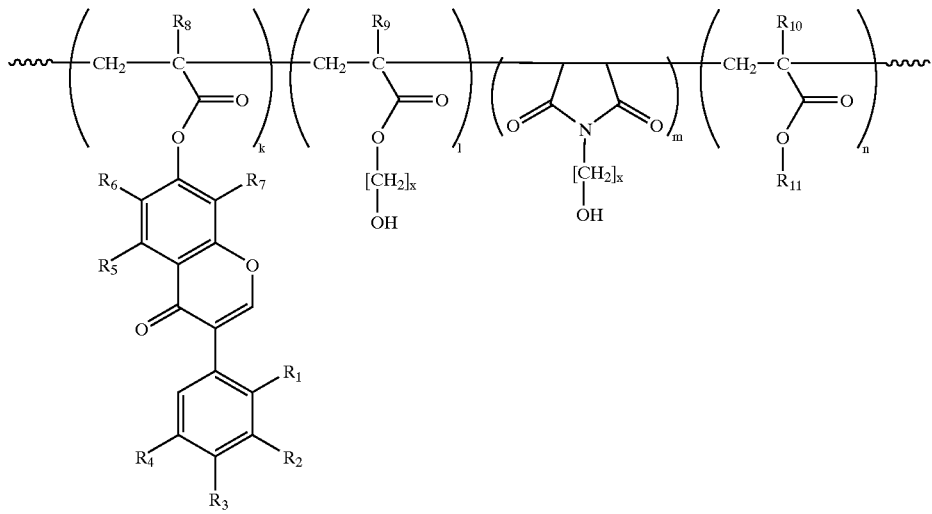

alkylated aminoplast crosslinker,
   an active or latent protonic acid catalyst for curing, and
   a low-to-medium boiling point alcohol-containing solvent, wherein, $R_1$~$R_7$ represent independently hydrogen, methoxy, hydroxy, halogen, aldehyde, alkoxyalkyl having one to six carbon atoms ($C_1$~$C_6$) or alkoxyalkane having one to five carbon atoms ($C_1$~$C_5$); $R_8$, $R_9$ and $R_{10}$ represent hydrogen or methyl group; $R_{11}$ represent alkyl group having from one to six carbon atoms ($C_1$~$C_6$); subscript x is from one to six; and the subscript k, l, m and n representing the mol ratio of each monomer has values that k is 0.1~0.5, l and m are 0.0~0.4 and n is 0.3~0.6 based on a total molar feed ratio of component k+l+m+n.

5. A semiconductor device containing a bottom antireflective coating material for using semiconductor fabrication, a structural formula of said semiconductor device represents:

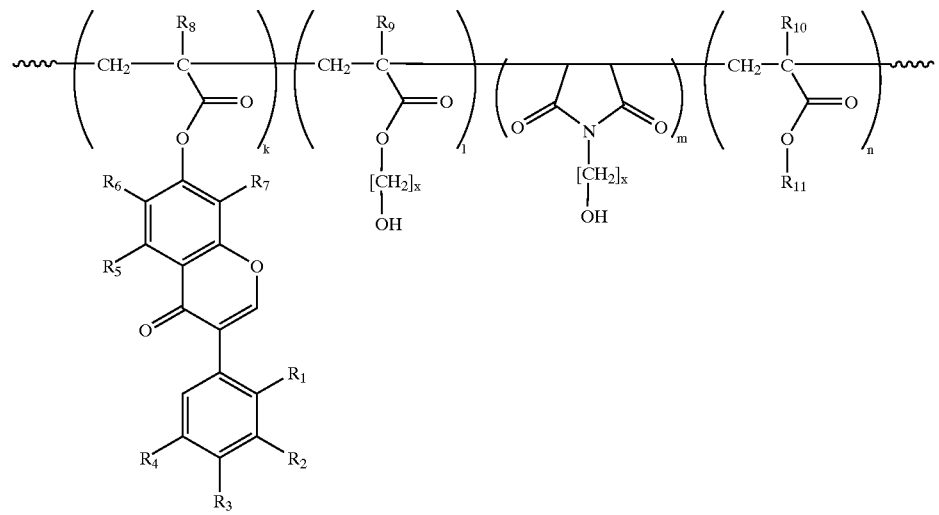

wherein, said bottom antireflective coating material is made of a binder polymer,
an acid catalyzed crosslinker and a low-to-medium boiling point alcohol-containing solvent, and wherein, $R_1$~$R_7$ represent independently hydrogen, methoxy, hydroxy, halogen, aldehyde, alkoxyalkyl having one to six carbon atoms ($C_1$~$C_6$) or alkoxyalkane having one to five carbon atoms ($C_1$~$C_5$); $R_8$, $R_9$ and $R_{10}$ represent hydrogen or methyl group; $R_{11}$ represent alkyl group having from one to six carbon atoms ($C_1$~$C_6$); subscript x is from one to six; and the subscript k, l, m and n representing the mol ratio of each monomer has values that k is 0.1~0.5, l and m are 0.0~0.4 and n is 0.3~0.6 based on a total molar feed ratio of component k+l+m+n.

6. A method for synthesizing an isoflavonyl methyl (meth) acrylate represented by a following chemical formula comprises steps of:

wherein, $R_1$~$R_7$ represent independently hydrogen, methoxy, hydroxy, halogen, aldehyde, alkoxyalkyl having one to six carbon atoms ($C_1$~$C_6$) or alkoxyalkane having one to five carbon atoms ($C_1$~$C_5$); and $R_8$ represents hydrogen or methyl group.

7. A method for synthesizing a binder polymer having repeating units in a main chain, including co- to quatro-, with a solution comprising a polymerization solvent selected from a group of dioxane, tetrahydrofuran, methylethylketone or aromatic solvent and a radical initiator selected from a group of benzoil peroxide (BPO), 2,2'-azobisisobutyronitrile (AIBN) or Di-tert-butyl peroxide (DTBP), and represented by a following structural formula, comprises steps of:

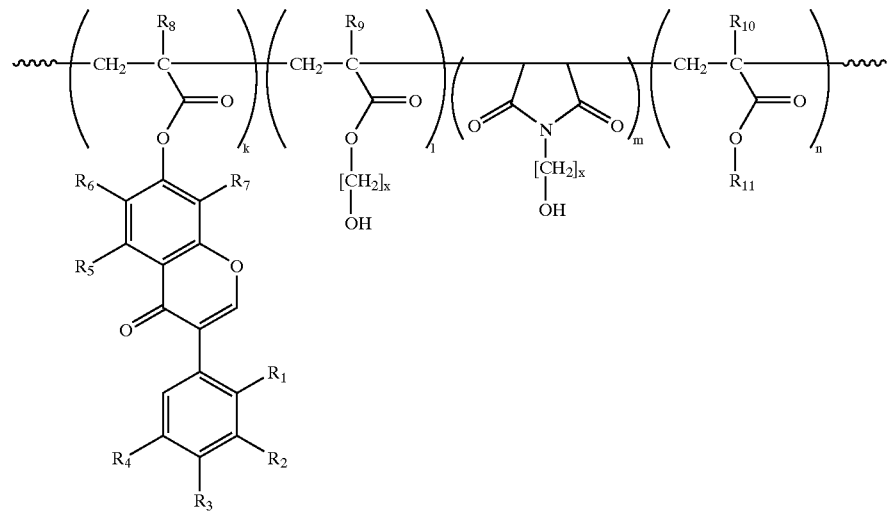

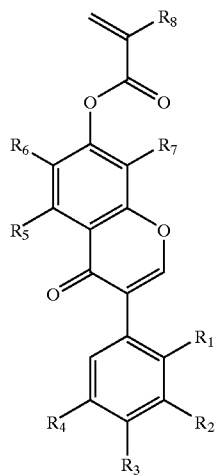

dissolving 7-hydroxyisoflavone derivatives into pyridine.

stirring solution for two to seven hours at temperature of 4° C. by gradually adding methacryloyl chloride, extracting filtered reactant several times with organic solvent, refining extracted reactant, and drying product in a vacuum for recovering isoflavonyl methacrylate, dissolving monomer being selected from a group of substituted or unsubstituted isoflavone chromophore monomer, hydroxyalkylmaleimide monomer, hydroyxalkylmethacrylate monomer, alkylmethacrylate monomer and 1~10 mol % of radical initiator with a solvent, polymerizing for 2~10 hours at temperature of 60° C. in a nitrogen environment, filtering and drying for synthesizing binder polymer, wherein, $R_1$~$R_7$ represent independently hydrogen, methoxy, hydroxy, halogen, aldehyde, alkoxyalkyl having one to six carbon atoms ($C_1$~$C_6$) or alkoxyalkane having one to five carbon atoms ($C_1$~$C_5$); $R_8$, $R_9$ and $R_{10}$ represent hydrogen or methyl group; $R_{11}$ represent alkyl group having from one to six carbon atoms ($C_1$~$C_6$); subscript x is from one to six; and the subscript k, l, m and n representing the mol ratio of each monomer has values that k is 0.1~0.5, l and m are 0.0~0.4 and n is 0.3~0.6 based on a total molar feed ratio of component k+l+m+n.

8. A method for producing an antireflective coating layer containing a binder polymer represented by a following structural formula comprises steps of:

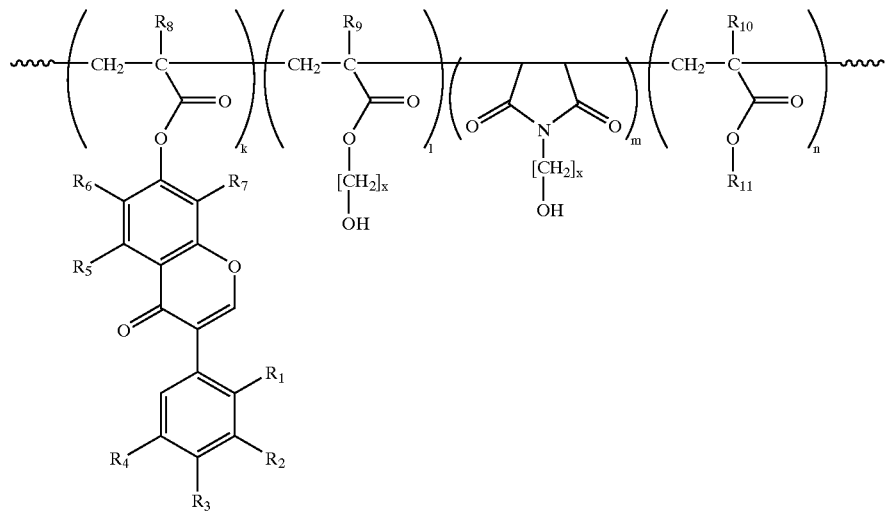

dissolving said polymer in a solvent being selected from a group consisting of propyleneglycol monomethylether acetate (PGMEA), ethyl 3-ethoxypropionate, methyl 3-methoxypropionate, and cyclohexanone;

spin-coating a solution on a silicone wafer;

baking at from about 110° C. to 250° C. for 30 to 120 seconds; and over-coating a photoresist;

wherein, $R_1 \sim R_7$ represent independently hydrogen, methoxy, hydroxy, halogen, aldehyde, alkoxyalkyl having one to six carbon atoms ($C_1 \sim C_6$) or alkoxyalkane having one to five carbon atoms ($C_1 \sim C_5$); $R_8$, $R_9$ and $R_{10}$ represent hydrogen or methyl group; $R_{11}$ represent alkyl group having from one to six carbon atoms ($C_1 \sim C_6$); subscript x is from one to six; and the subscript k, l, m and n representing the mol ratio of each monomer has values that k is 0.1~0.5, l and m are 0.0~0.4 and n is 0.3~0.6 based on a total molar feed ratio of component k+l+m+n.

* * * * *